United States Patent
Hamawaki et al.

(10) Patent No.: US 6,609,237 B1
(45) Date of Patent: Aug. 19, 2003

(54) ROUTING PATH FINDING METHOD FOR AUTOMATED ROUTING/DESIGNING PROCESS AND COMPUTER-READABLE STORAGE MEDIUM HAVING STORED THEREON ROUTING PATH FINDING PROGRAM

(75) Inventors: Koji Hamawaki, Osaka (JP); Masahiro Fukui, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 256 days.

(21) Appl. No.: 09/626,159

(22) Filed: Jul. 26, 2000

(30) Foreign Application Priority Data

Aug. 3, 1999 (JP) ............................. 11-220198

(51) Int. Cl.$^7$ ................................. G06F 9/45
(52) U.S. Cl. .................. 716/10; 716/12; 716/14
(58) Field of Search ...................... 716/12, 13, 14, 716/10

(56) References Cited

U.S. PATENT DOCUMENTS

| | | | | |
|---|---|---|---|---|
| 4,613,941 A | * | 9/1986 | Smith et al. | 716/12 |
| 5,309,370 A | * | 5/1994 | Wong | 716/13 |
| 5,535,134 A | * | 7/1996 | Cohn et al. | 716/8 |
| 6,014,507 A | * | 1/2000 | Fujii | 716/12 |
| 6,209,123 B1 | * | 3/2001 | Maziasz et al. | 716/14 |
| 6,317,864 B1 | * | 11/2001 | Kikuchi et al. | 716/11 |
| 6,330,707 B1 | * | 12/2001 | Shinomiya et al. | 716/14 |
| 6,378,121 B2 | * | 4/2002 | Hiraga | 716/13 |
| 6,385,758 B1 | * | 5/2002 | Kikuchi et al. | 716/2 |

FOREIGN PATENT DOCUMENTS

| | | |
|---|---|---|
| JP | 04160570 | 6/1992 |
| JP | 5-205011 | 8/1993 |
| JP | 07234883 | 9/1995 |
| JP | 11161694 | 6/1999 |
| JP | 11-163152 | 6/1999 |

OTHER PUBLICATIONS

"The Lee Path Connection Algorithm", F. Rubin, IEEE Transactions on Computers, vol. C–23, No. 0, Sep. 1974, pp. 907–914.

* cited by examiner

*Primary Examiner*—John F. Niebling
*Assistant Examiner*—Stacy A Whitmore
(74) *Attorney, Agent, or Firm*—McDermott, Will & Emery

(57) ABSTRACT

In an automatic routing/designing process of an LSI using a maze algorithm, multiple sub-regions, formed by getting a grid column partitioned by a component placed in a routing region, are extracted. And grid point availability, representing the number of grid points available for routing, is obtained for each of these sub-regions. Also, if there is any open net, then the component is vertically moved upward by one grid unit, for example, to make the net routable. If the grid point availability of a sub-region, used for routing another net, has become negative as a result of the movement of the component, then the net is rerouted to pass other sub-regions. Accordingly, even if a height constraint, for example, has been imposed on the routing region, all of the nets can be routed successfully with the constraint satisfied without increasing the number of grid points in the column direction. As a result, the number of open nets can be minimized and all of the nets are much more likely to be routed successfully.

7 Claims, 13 Drawing Sheets

| SUB-REGION | 31 | 32 | 33 | 34 | 35 | 36 | 37 | 38 | 39 |
|---|---|---|---|---|---|---|---|---|---|
| AVAILABILITY | 0 | 1 | 0 | 0 | 1 | 0 | 1 | 0 | 0 |

(b)

ROUTING PATH FINDING METHOD FOR AUTOMATED ROUTING/DESIGNING PROCESS AND COMPUTER-READABLE STORAGE MEDIUM HAVING STORED THEREON ROUTING PATH FINDING PROGRAM

BACKGROUND OF THE INVENTION

The present invention generally relates to an improved routing path finding method for use in the automatic routing/designing process of an LSI. More specifically, the present invention relates to a method for finding a routing path by applying a maze algorithm to a routing region partitioned into a plurality of grid points. In particular, the method of the present invention is adapted to find a routing path while satisfying a height or width constraint, imposed on a routing region, irrespective of the number of grid points included in the routing region.

A maze algorithm is one of known routing path finding techniques. The maze algorithm is disclosed, for example, by Frank Rubin in "The Lee Path Connection Algorithm", 1974 IEEE Transactions on Computers, Vol. c-23, No.9. Hereinafter, a known routing path finding method by the maze algorithm will be described with reference to FIG. 6.

First, in Step S10, interconnection information is input. Next, in Step S20, currently available grid points are extracted. Available grid points adjacent to a grid point in a list L, i.e., non-occupied grid points other than those specified as being located in a routing forbidden region and grid points in which terminals are located, are put into a list L1. At the same time, search directions from the grid point in the list L toward the respective available grid points are saved. And the grid points in the list L1 are extracted as available grid points.

Then, in Step S40, wire length costs are added while the available grid points, extracted in Step S20, are being searched. Every time one grid point is passed, a wire length cost of "1" is added. Next, a particular grid point, which can be reached from the source grid point at a minimum cost, is selected from the grid points in the list L1 and inserted into the list L.

Subsequently, in Step S50, it is determined whether or not a sink terminal has been reached. If the answer is YES, then the process advances to the next step S60. Otherwise, the process returns to Step S20. In other words, if the sink grid point is included in the list L, then the process advances to the next Step S60 of selecting a minimum cost path. Otherwise, the process returns to Step S20.

In Step S60, a minimum cost path is selected by tracing back the path in the search directions saved in Step S20.

Hereinafter, this process will be described in more detail with reference to FIG. 7. In the illustrated example, the number of interconnection layers is assumed to be one for the sake of simplicity. A routing region 20 is partitioned into a large number of grid points 30. In the routing region 20, terminals 10A, 10a, 10B, 10b, 10C and 10c and a routing forbidden region 21 are present.

In Step S10, interconnection information is input. The three enclosed numerals "1", "2" and "3" attached to the terminals 10A, 10a, 10B, 10b, 10C and 10c indicate the numbers of respective nets and a pair of terminals with the same number (e.g., the terminals 10A and 10a with "1") should be interconnected together.

For example, Net 1 can be routed in the following manner. The source terminal of Net 1 is the terminal 10A and the sink terminal thereof is the terminal 10a. In Step S20, first, the grid point where the source terminal 10A is placed is put into the list L. Then, available grid points adjacent to the source terminal 10A are put into the list L1. In this example, four grid points vertically and horizontally adjacent to the source terminal 10A are put into the list L1. At the same time, the search directions indicated by the arrows in FIG. 7 are saved. And the four grid points in the list L1 are extracted as available grid points.

Next, in Step S40, every time a single grid point has been passed, a wire length cost of "1" is added.

Then, at least one grid point with a minimum cost is/are selected from the list L1 and put into the list L. Since all of the four grid points currently present in the list L1 have the same cost of "1", all of these four grid points are transferred into the list L.

Subsequently, since it is determined in Step S50 that the sink terminal 10a has not been reached yet, the process returns to Step S20. Thereafter, until the sink terminal 10a is reached, the same processing steps S20, S40 and S50 will be performed repeatedly.

In FIG. 7, the numbers in respective grid points represent the results obtained by adding the wire length costs together.

Suppose it is determined in Step S50 that the sink terminal grid 10a is included in the list L after the same set of process steps have been performed several times. Then a path, starting from the sink terminal 10a, is traced back in the search directions represented by the arrows in FIG. 7 in Step S60, thereby extracting a minimum cost path 40.

The routing results are illustrated in FIG. 8(a). FIG. 8(b) illustrates the results obtained by compacting downward the nets shown in FIG. 8(a). By performing compaction, not only nets but also terminals or routing forbidden region can be moved downward if there are any spaces available. Thus, the terminals 10A and 10c have been moved downward.

In a conventional routing path finding method, if routing is performed on a routing region partitioned into an insufficient number of grid points, then nets already routed sometimes prevent routing. Thus, to complete routing, a sufficient number of grid points should be prepared by adding grid points either from the beginning or after it has been determined that routing cannot be completed.

However, if height or width constraint is imposed on a routing region, the insertion of additional grid points possibly causes failure to comply with the constraint. A situation like this will be described with reference to FIGS. 9 through 11. The following example is a method for routing and designing a standard cell applicable to the design of an ASIC.

In FIGS. 9 through 11, a height constraint 101 is normally imposed on a standard cell 100. In the cell 100, transistors 50A and 50B, terminals 10 and power lines 60 are present. In the illustrated example, even though the cell actually has a multilevel interconnection structure, only the nets in the first layer (a first metallization layer 71 for a standard cell) are illustrated for the sake of simplicity.

In FIG. 9, a grid unit 32 is defined by uniformly partitioning the cell by the routing pitch of the first interconnection layer 71. If maze routing is completed on the grid with a uniform routing pitch, then the height constraint on the cell will be satisfied automatically. In other words, to complete routing successfully, a space should be provided beforehand for the nets passing between the transistors 50A and 50B.

However, it is very difficult to accurately estimate the space between the transistors before the routing is started. In fact, in an actual routing/designing process carried out manually, trials and errors are inevitable because routing and transistor spacing should be performed in parallel.

For example, if the space between the transistors 50A and 50B, obtained by pre-routing estimation, is too narrow as shown in FIG. 10, then routing should fail or cannot be completed because of the shortage in number of grid points. As can be seen, the terminals 10A and 10B cannot be interconnected together because there are no grid points available between them.

To solve this problem, according to a conventional method, a grid row with a height 32B narrower than the routing pitch (i.e., the normal grid unit 32A) is provided between the transistors 50A and 50B as shown in FIG. 11, thereby completing routing. Thereafter, spaces between transistors and between nets are adjusted through compaction to obtain the same results as those illustrated in FIG. 9.

However, if such a narrow grid row is inserted as shown in FIG. 11, then the number of grid points increases vertically. Thus, in accordance with this conventional method, the height constraint 101 on the cell 100 cannot be satisfied. In the foregoing example, a height constraint cannot be satisfied. A similar problem will happen when a width constraint is imposed.

Thus, to complete the routing process successfully even if the height or width constraint is imposed on the routing region, the present inventors proposed a routing path finding method in U.S. patent application Ser. No. 09/157,387. According to the proposed method, availability, or the number of grid points available for routing, is obtained for a grid column or row, on which the height or width constraint is imposed. And this availability is regarded as an additional cost required by the maze algorithm. Specifically, if a path to be found passes a grid column or row while the routing region is being searched, a passage cost is obtained based on the availability obtained for the grid column or row. And the passage cost is added to a routing path cost. In this manner, the routing path cost is always controlled so as to avoid failure to comply with the height or width constraint.

According to this routing path finding method, the routing process is much more likely to be completed successfully with the height and width constraints all satisfied, because the availability is defined for each grid column or row to meet the constraint. However, if a component to be placed (e.g., transistor) or a routing forbidden region overlaps a plurality of grid columns or rows in the routing region, then routing might be impossible, even if it has been determined by the availability that the routing is possible. This is because actually two routing paths might pass a single grid point in the grid column or row with that availability.

SUMMARY OF THE INVENTION

An object of the invention is providing a routing path finding method for an automatic routing/designing process of an LSI with the height or width constraint, imposed on a routing region, satisfied without adding any extra grid column or row in the direction in which the constraint is imposed.

To achieve this object, according to the present invention, multiple availabilities, not the single availability, are obtained for a single grid column or row in the routing region.

In addition, according to the present invention, a component (e.g., transistor) to be placed over multiple grid points is not fixed at a position. Instead, if there is any open net with that component fixed, then the component is moved to an appropriate position, thereby arranging a series of available grid points in the column or row direction. In this manner, the open net can be made routable through these available grid points.

An inventive method is adapted to find a routing path during an automated routing/designing process of an LSI by applying a maze algorithm to a routing region partitioned into multiple grid points arranged in columns and rows. In accordance with the maze algorithm, a path cost is calculated by adding a cost every time one of the grid points is passed. The method includes the step of a) extracting multiple sub-regions from each said column or row in the routing region. The sub-regions are formed by getting the column or row partitioned by a component like a transistor and a routing forbidden region existing in the routing region. The method further includes the steps of: b) obtaining a parameter for each said sub-region, which has been extracted in the step a), based on the number of nets that can pass the sub-region and the number of nets already routed in the sub-region; and c) calculating, using the parameter obtained in the step b), the cost to be added every time one of the grid points is passed.

Another inventive method is also adapted to find a routing path during an automated routing/designing process of an LSI by applying a maze algorithm to a routing region partitioned into multiple grid points arranged in columns and rows. In accordance with the maze algorithm, a routing path cost is calculated by adding a cost every time one of the grid points is passed responsive to a request that terminals of a component like a transistor, placed in the routing region, be interconnected. The method includes the steps of: a) moving the component such that available ones of the grid points are arranged in line if there is any open net between any pair of the terminals to be interconnected; and b) recalculating the routing path cost after the step a) has been performed.

Still another inventive method is also adapted to find a routing path during an automated routing/designing process of an LSI by applying a maze algorithm to a routing region partitioned into multiple grid points arranged in columns and rows. In accordance with the maze algorithm, a routing path cost is calculated by adding a cost every time one of the grid points is passed responsive to a request that terminals of a component like a transistor, placed in the routing region, be interconnected. The method includes the step of a) extracting multiple sub-regions from each said column or row in the routing region. The sub-regions are formed by getting the column or row partitioned by the component and a routing forbidden region. The method further includes the steps of: b) obtaining a parameter for each said sub-region, which has been extracted in the step a), based on the number of nets that can pass the sub-region and the number of nets already routed in the sub-region; c) calculating, using the parameter obtained in the step b), the cost to be added every time one of the grid points is passed; d) moving the component such that available ones of the sub-regions are arranged in line if there is any open net between any pair of the terminals to be interconnected; and e) recalculating the routing path cost by performing the steps b) and c) after the step d) has been performed.

In one embodiment of the present invention, the parameter obtained in the step b) for each said sub-region is preferably availability of grid points. The availability is obtained by subtracting the number of grid points occupied by the nets already routed from the number of grid points included in the sub-region.

In another embodiment of the present invention, the component may overlap at least two of the grid columns or at least two of the grid rows.

In still another embodiment, the method may further include the step of determining, after the component has been moved, whether or not there is any sub-region in which the number of nets already routed exceeds the number of nets that can pass the sub-region. If there is any such sub-region in which the number of nets already routed exceeds the number of nets that can pass the sub-region, then the method may further include the step of rerouting the nets passing the sub-region.

The present invention also provides a computer-readable storage medium having stored thereon a routing path finding program, which implements the inventive routing path finding method applicable to the automatic routing/designing process.

According to the present invention, multiple sub-regions are extracted from each of the grid columns or rows in which a component or routing forbidden region is located, and a parameter representing the availability of grid points is obtained for each of these sub-regions. Thus, compared to the method of obtaining a single availability for each grid column or row as proposed by us in the above-identified patent application, a far greater number of availability information items can be obtained from the routing region. Accordingly, even if a height or width constraint has been imposed on the routing region, all of the nets are much more likely to be routed successfully with that constraint fully satisfied.

In addition, according to the present invention, if the existence of a component, like a transistor, overlapping multiple grid points makes at least net open (or non-routable), then the component is moved to arrange available grid points in line along a column or row. Thus, the open net can be routed through these grid points.

DESCRIPTION OF THE PREFERRED EMBODIMENTS

Hereinafter, preferred embodiments of the present invention, will be described with reference to the accompanying drawings.

EMBODIMENT 1

Figure 1:
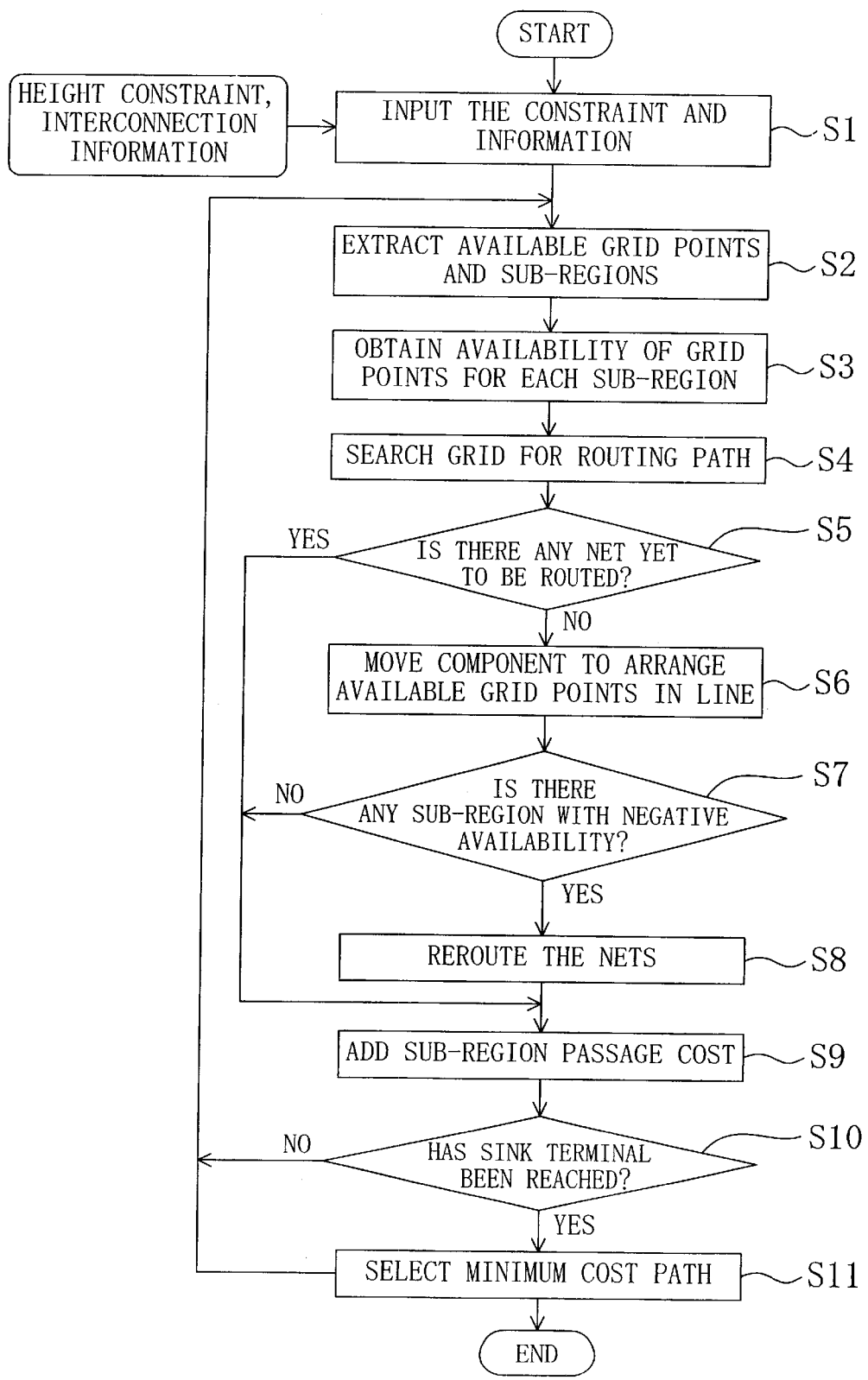
FIG. 1 is a flowchart illustrating respective process steps of a routing path finding method according to a first embodiment of the present invention.

FIG. 1 is a flow chart illustrating respective process steps of a routing path finding method according to a first embodiment of the present invention. A routing path finding program, illustrated by this flowchart, is stored on a computer-readable storage medium and used for routing and designing an LSI by a computer.

As shown in FIG. 1, first, the height constraint and interconnection information for a routing region is input in Step S1. A specific example of the height constraint and interconnection information will be described with reference to FIG. 2.

Figure 2:
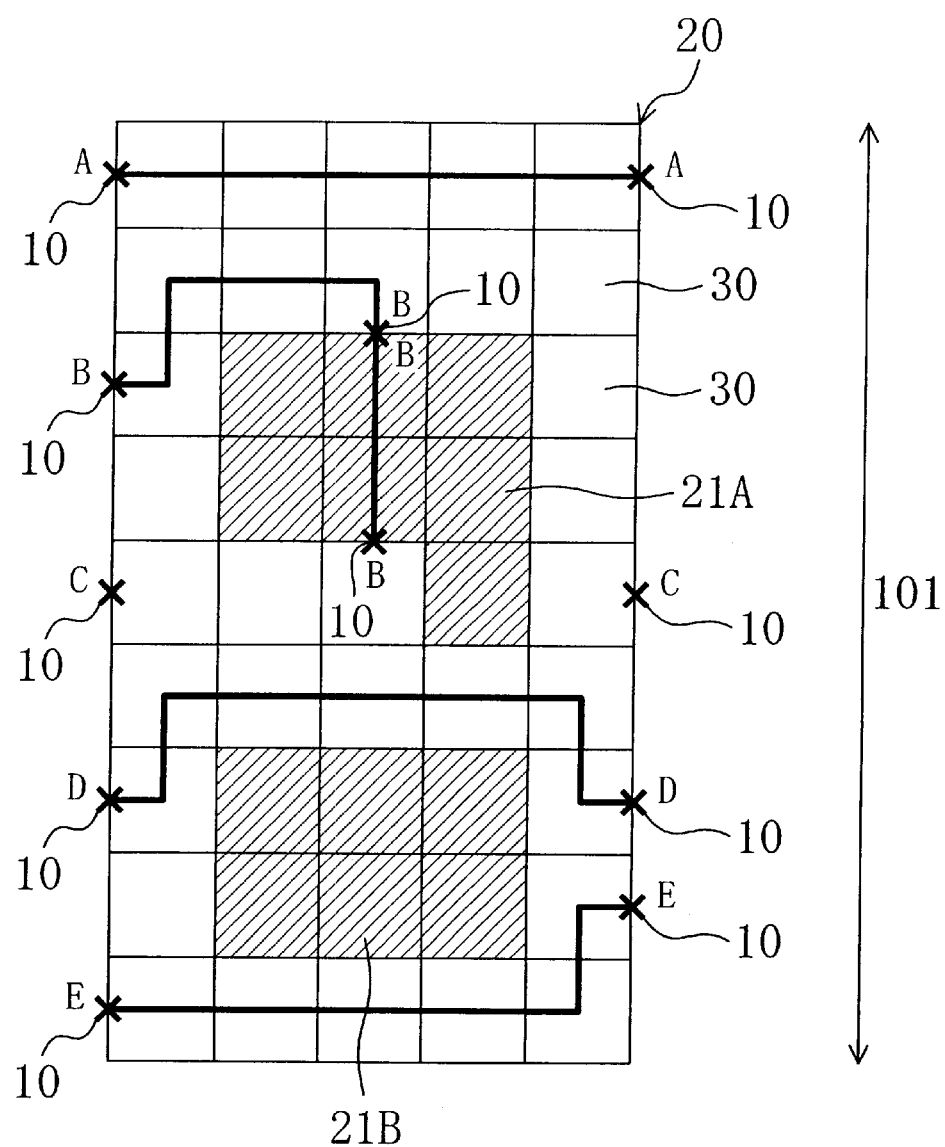
FIG. 2 illustrates height constraint and interconnection information for use in the method of the first embodiment.

In FIG. 2, a routing region 20 is partitioned into a large number of grid points 30 arranged in columns and rows. In the routing region 20, fixed-shape components 21A and 21B to be placed, e.g., transistors, and terminals 10 exist. The component 21A overlaps three grid columns and three grid rows, while the component 21B overlaps the three grid columns and two grid rows. The terminals 10 include two terminals of the component 21A, and nine external terminals placed at the ends of the routing region 20 and to be connected to an external system. Although not shown in FIG. 2, a routing forbidden region may also be defined in the routing region 20.

A height constraint 101 of "9", which is the maximum number of grid points in the column direction, is imposed on the routing region 20. No width constraint is imposed in the illustrated example, but that constraint may be naturally imposed.

The reference signs A through E attached to the respective terminals 10 represent the numbers of nets. That is to say, a pair of terminals 10 with the same net number should be interconnected together. In the following example, it will be described how to route Net C after the other Nets A, B, D and E have already been routed to make inventive concept more easily understandable. Also, in this example, the number of interconnection layers is supposed to be one. Furthermore, in FIG. 2, a net interconnecting together the two terminals B, B located at the ends of the component 21A is an internal net placed inside the component 21A.

Figure 3:
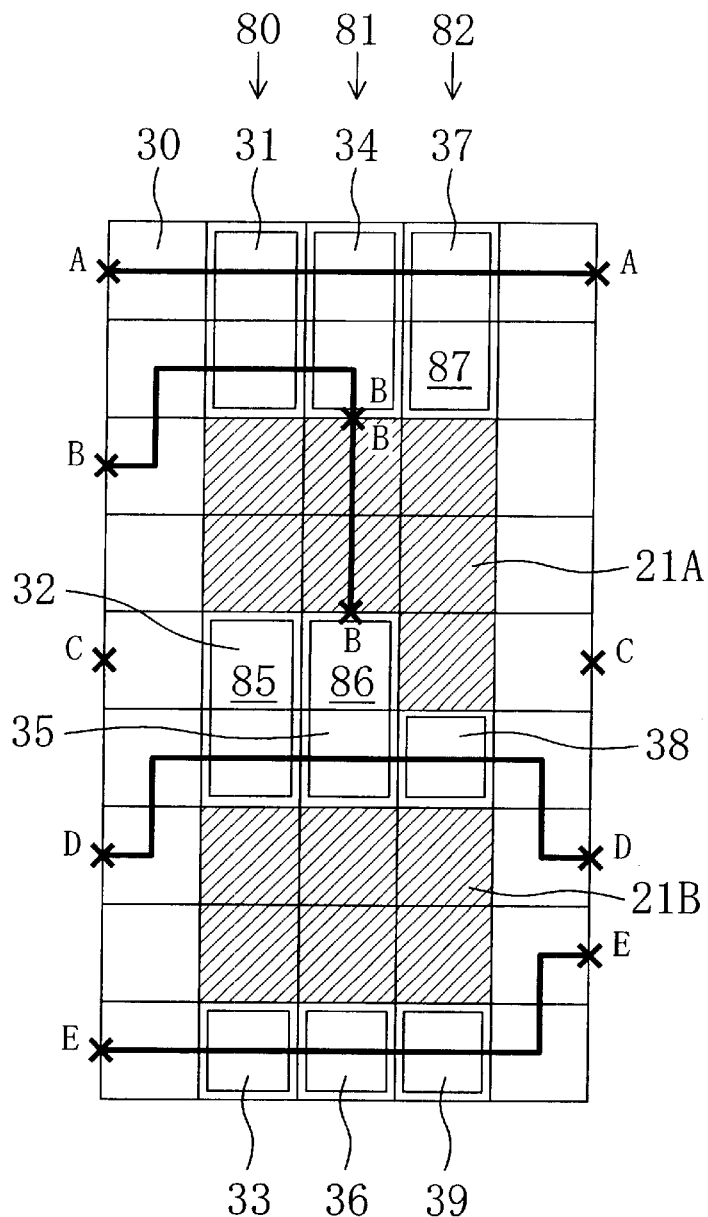
FIG. 3 illustrates how to obtain the availability for each sub-region in the method of the first embodiment.
Figure 6:
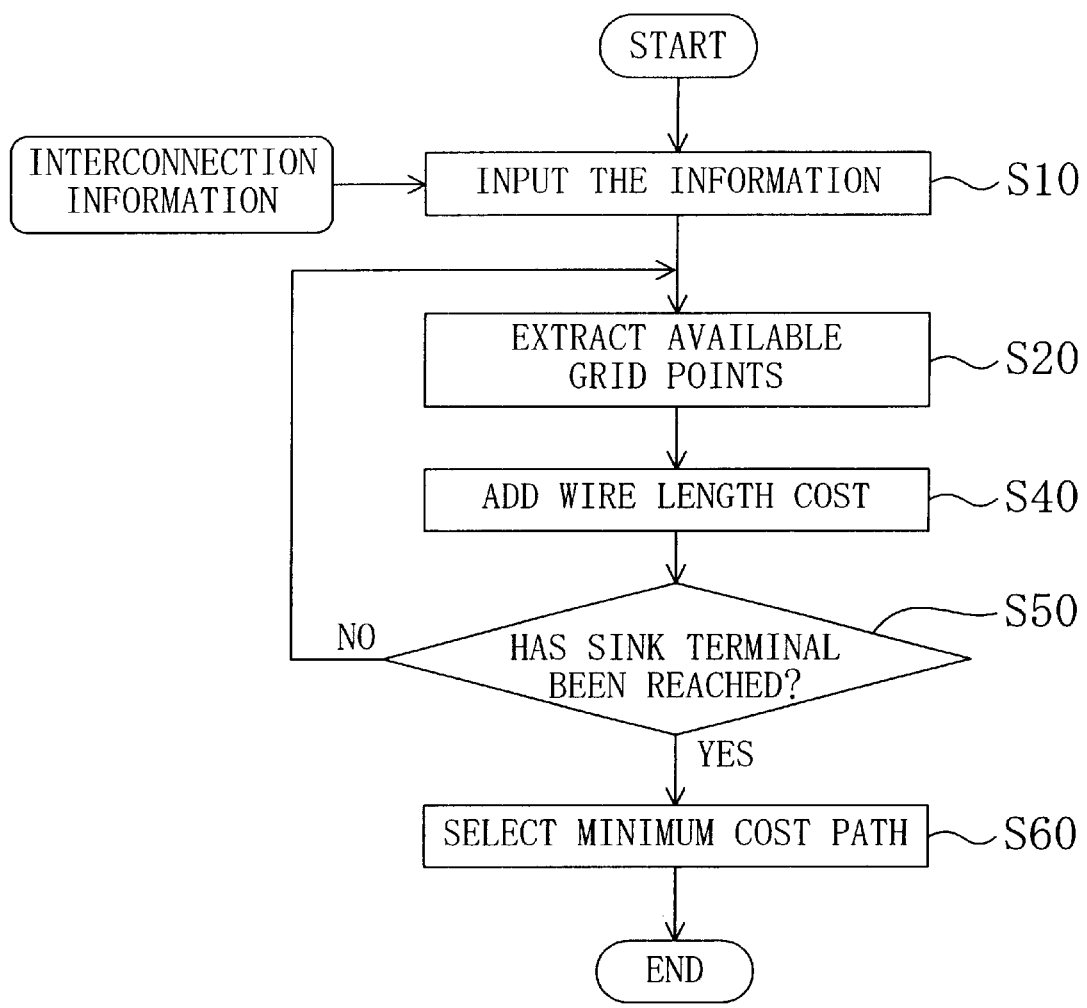
FIG. 6 is a flowchart illustrating respective process steps of a known routing path finding method.
Figure 7:
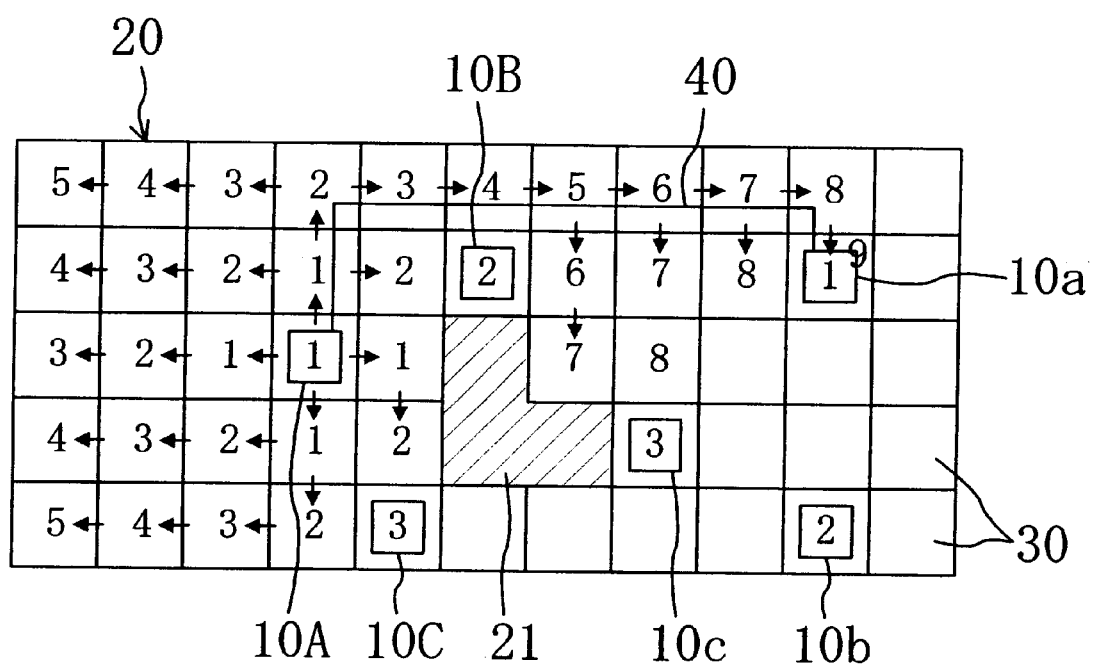
FIG. 7 illustrates how to find a routing path by the known method.
Figure 8A:
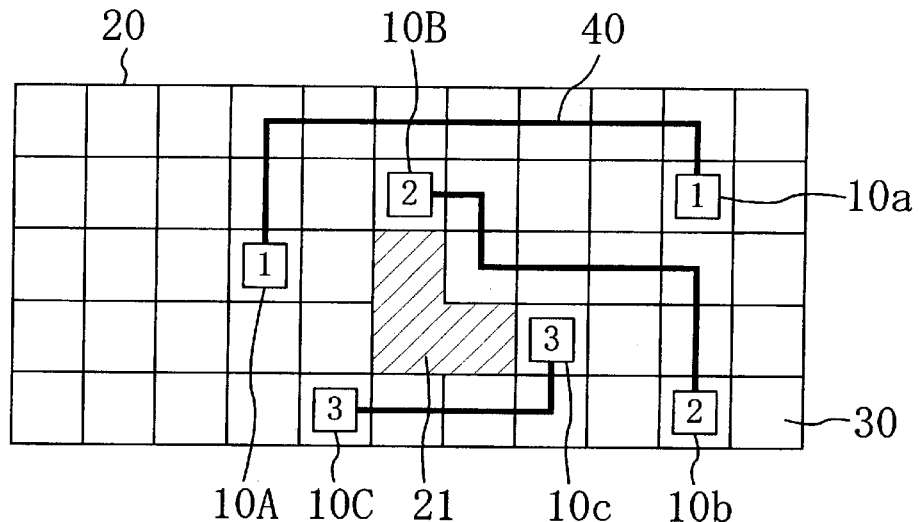
FIG. 8(a) illustrates a result of the known routing path finding process.
Figure 8B:
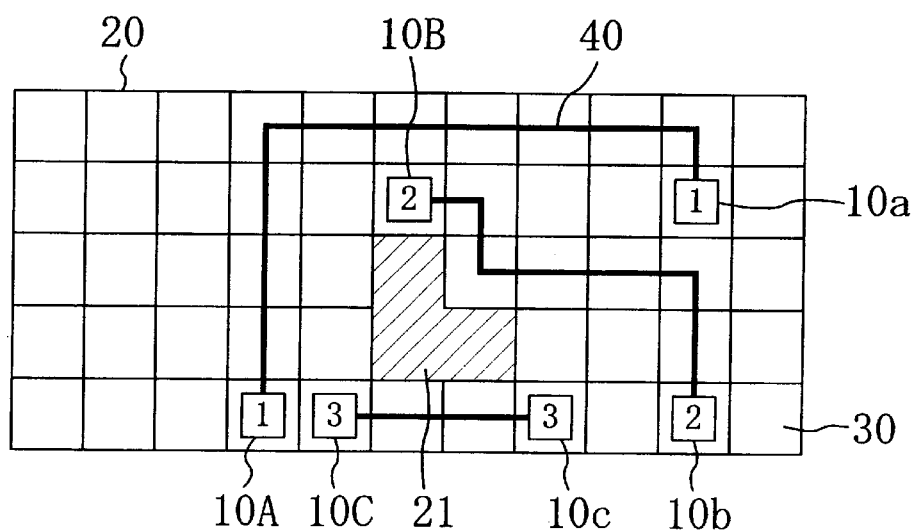
FIG. 8(b) illustrates a result of the compaction carried out on the routing region shown in FIG. 8(a).
Figure 9:
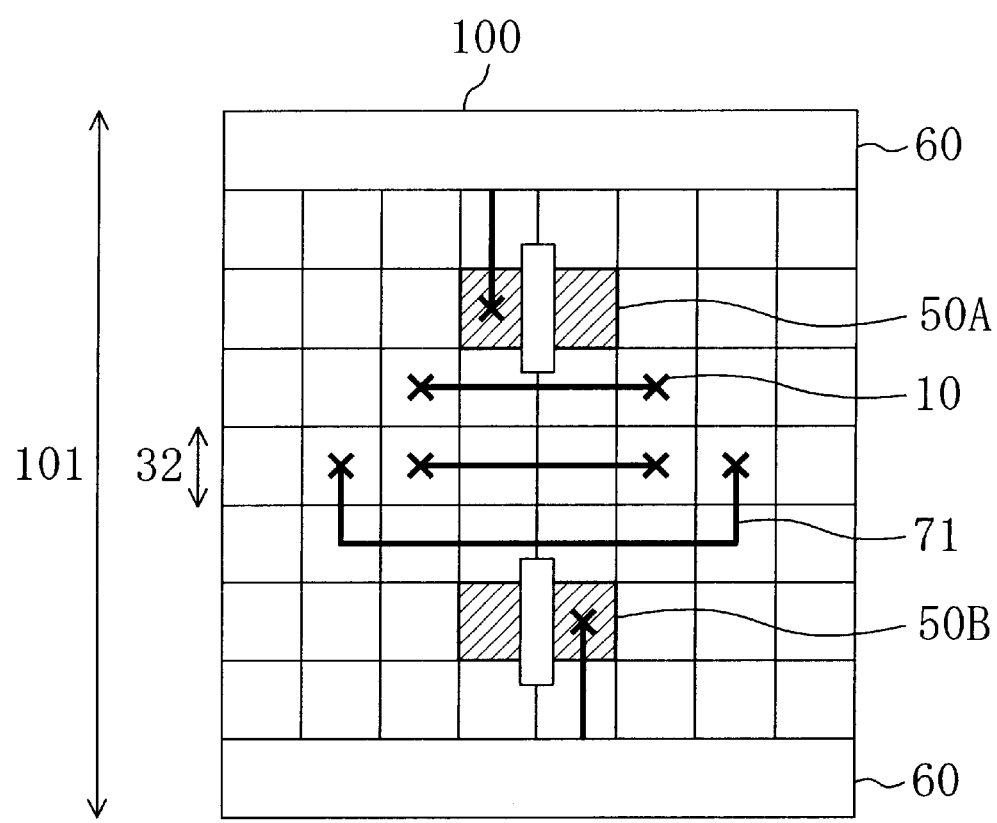
FIG. 9 illustrates a result of a routing/designing process performed on a standard cell using a grid uniformly partitioned at a routing pitch in the known method.
Figure 10:
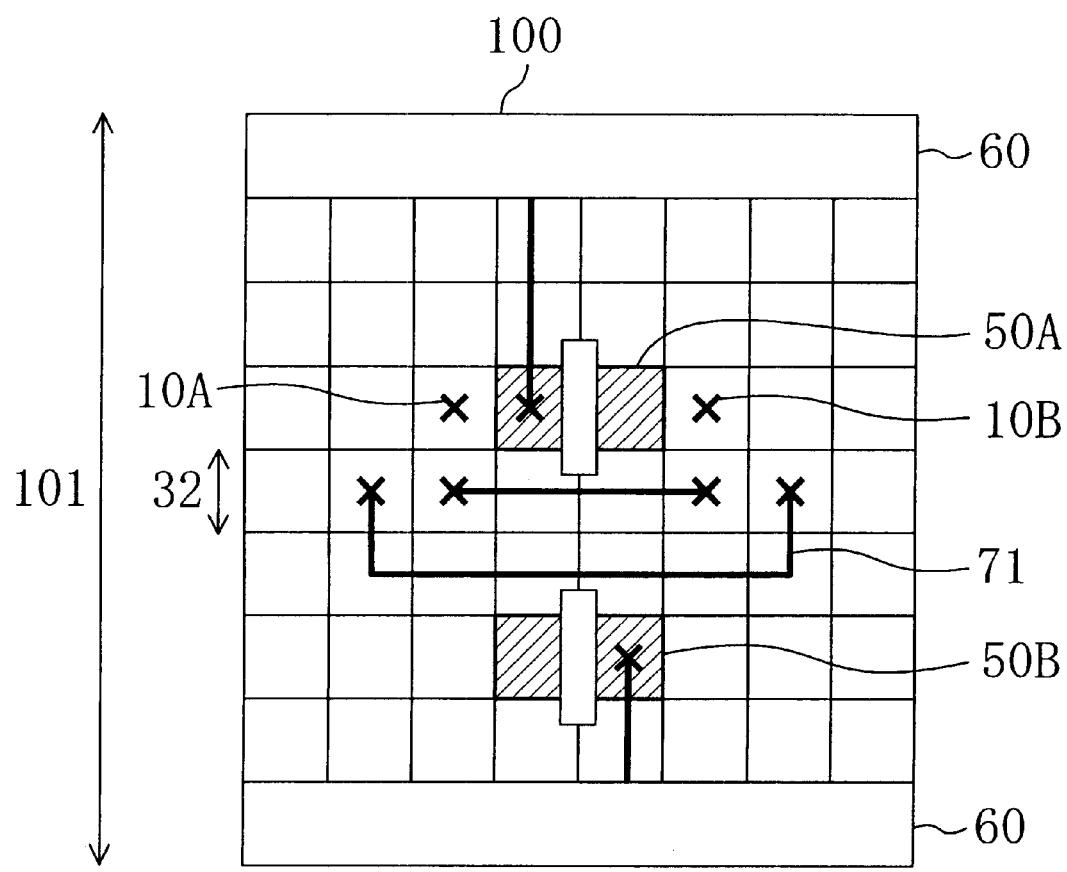
FIG. 10 illustrates a situation where routing cannot be completed because of shortage in number of grid points in the known method.
Figure 11:
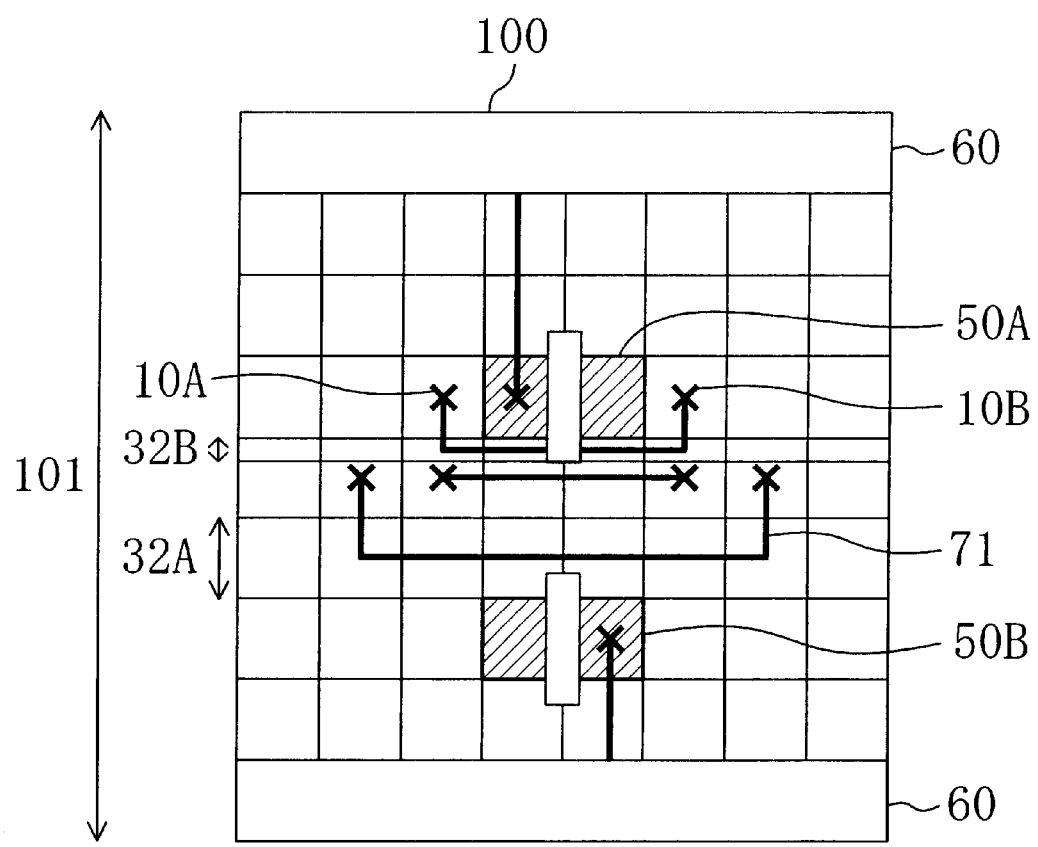
FIG. 11 illustrates a situation where routing is completed by providing a grid row with a height smaller than the routing pitch in the known method.

As shown in FIG. 1, after Step S1 has been performed, available grid points and sub-regions are extracted in Step S2. As in Step S20 of the known method shown in FIG. 6, currently available grid points are also extracted. In addition, several sub-regions, formed in each grid column partitioned by the components 21A and 21B, are also extracted. For example, these sub-regions are extracted from the three grid columns 80, 81 and 82 in which the components 21A and 21B are placed as shown in FIG. 3. Specifically, three sub-regions 31, 32 and 33 are extracted from the grid column 80, another three sub-regions 34, 35 and 36 are extracted from the grid column 81 and still another three sub-regions 37, 38 and 39 are extracted from the grid column 82.

Thereafter, in Step S3, the availability of grid points is obtained for each of the sub-regions. Specifically, the availability is a type of parameter obtained by the number of nets that can pass a sub-region (i.e., the number of grid points included in the sub-region) and the number of nets already routed (i.e., the number of grid points occupied by the nets). That is to say, the availability is given by the following equation:

Availability=Number of grid points included in sub-region—Number of grid points occupied by nets In the example illustrated in FIG. 3, the sub-region 32 includes two grid points, and a single net D passes through one of these two grid points. Accordingly, the availability of the sub-region 32 is "1" (=2−1). The respective availabilities of the other sub-regions 31 and 33 through 39 are obtained in the same way and shown at the bottom of FIG. 3.

Subsequently, in Step S4, the grid is searched to find an appropriate path. In this process step, one of the grid points is passed after another to route a net in accordance with the maze algorithm. Next, in Step 5, it is determined whether or not there is any net yet to be routed (i.e., for which a routing path should be found). If the answer is YES, then the process jumps to Step S9 of adding sub-region passage costs. Otherwise, the process advances to the next Step S6 of moving a component to find a path passing a series of available grid points. Since there is at least one net to be routed at the beginning, the former case will be described first.

In Step S9, every time a single sub-region is passed, a predetermined sub-region passage cost is added, thereby calculating a total routing path cost. Hereinafter, this process step will be described in detail. Specifically, when each of the available grid points, obtained in Step S2, is reached, a sub-region passage cost, which is defined for the sub-region including the grid point in question by the availability obtained in Step S3, is added. A sub-region with availability S has its sub-region passage cost defined as follows:

Sub-region passage cost=100(if $S \leq 0$) or

Sub-region passage cost=0(if $S > 0$)

In this case, if S is equal to or smaller than 0, the sub-region passage cost does not have to be "100" but may be any other large value getting another path selected. Although not described in detail, a wire length cost is also imposed in this embodiment as in the prior art. Thus, every time a grid point is passed, a cost of "1" is added. Also, if a path should pass a contact that connects two interconnection layers together, a contact cost is further added. By adding the wire length cost and the sub-region passage cost (and the contact cost if necessary) together, a routing path cost is obtained.

Next, in Step S10, it is determined whether or not each net being routed has reached a grid point where the sink terminal is located. If the answer is NO, the process returns to Step S2. Alternatively, if the answer is YES, then the process advances to the next Step S11 of selecting a minimum cost path. In this Step S11, a routing path with a minimum path cost is selected from a plurality of candidate routing paths found. Then, the process returns to Step S2 to repeatedly perform the process steps S2 through S11. And when all of the nets are routed and the minimum cost paths are found for all of these nets, the process ends.

On the other hand, in Step S6, if it turned out in Step S3 and S4 that there is at least one open net (i.e., any net for which no routing path can be found), the component 21A or 21B is moved tentatively. As described above, a component such as a transistor is placed at a fixed position in the prior art. In contrast, according to the present invention, if there is any open net, the component is moved to make the net in question routable. In the example illustrated in FIG. 3, no path can be found for Net C as it is.

Figure 4:
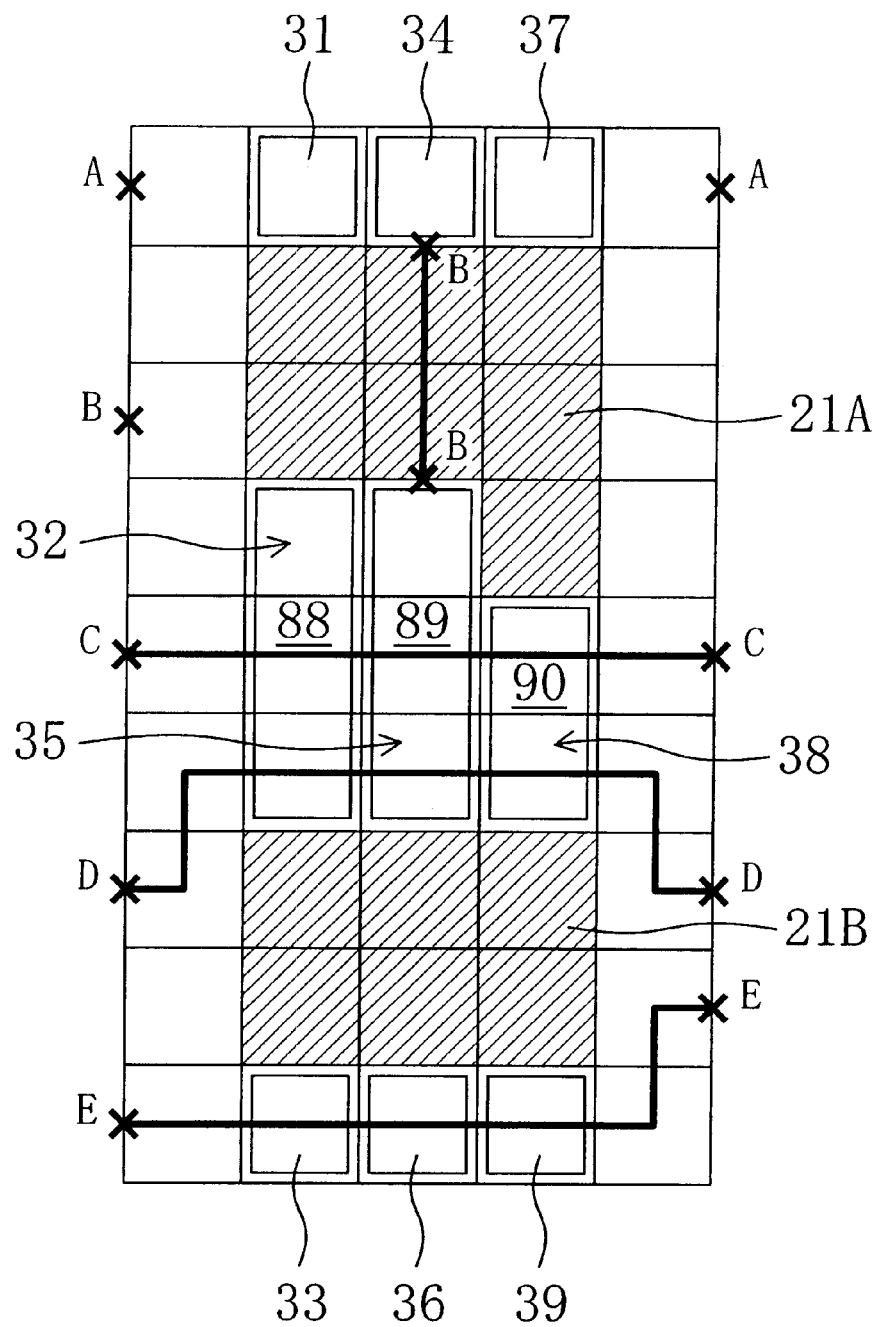
FIG. 4 illustrates a specific example of the method of the first embodiment in which a component has been moved.

Look at the component 21A shown in FIG. 3. As can be seen, there are three grid points 85, 86 and 87 available for routing in the three sub-regions 32, 35 and 37, respectively, around the component 21A. In other words, each of the sub-regions 32 and 35 located below the component 21A has an availability of "1", and the sub-region 37 located above the component 21A also has an availability of "1". Accordingly, if the component 21A is moved upward by one grid unit as shown in FIG. 4, then each of the three sub-regions 32, 35 and 38, located below the component 21A, will have at least one available grid point 88, 89, 90, respectively. Thus, these grid points 88, 89 and 90 can be arranged in line (i.e., in a row) and Net C, which was an open net in the arrangement shown in FIG. 3, can now be routed along that row. Taking this result into consideration, the component 21A is vertically moved upward along the columns by one grid unit, and Net C is routed using the available grid points 88, 89 and 90 of the sub-regions 32, 35 and 38 in Step S6.

Thereafter, in Step 57, it is determined whether or not any sub-region comes to have a negative availability as a result of the movement of the component in Step S6. More specifically, it is determined whether or not the number of grid points occupied (i.e., the number of nets already routed) has exceeded the number of available grid points (i.e., the number of routable nets) in any of the sub-regions. In the arrangement shown in FIG. 3, the availabilities of the sub-regions 31 and 34 used for routing Nets A and B are both "0". In the arrangement shown in FIG. 4 on the other hand, since the component 21A has been moved upward, the availabilities of the sub-regions 31 and 34 located above the component 21A are now "−1". Accordingly, in the example illustrated in FIG. 4, the answer to the query in Step S7 is YES, i.e., there are sub-regions 31 and 34 with a negative availability. Thus, the process advances to the next rerouting step S8. Alternatively, if the answer is NO, then the process jumps to Step S9 immediately.

Figure 5:
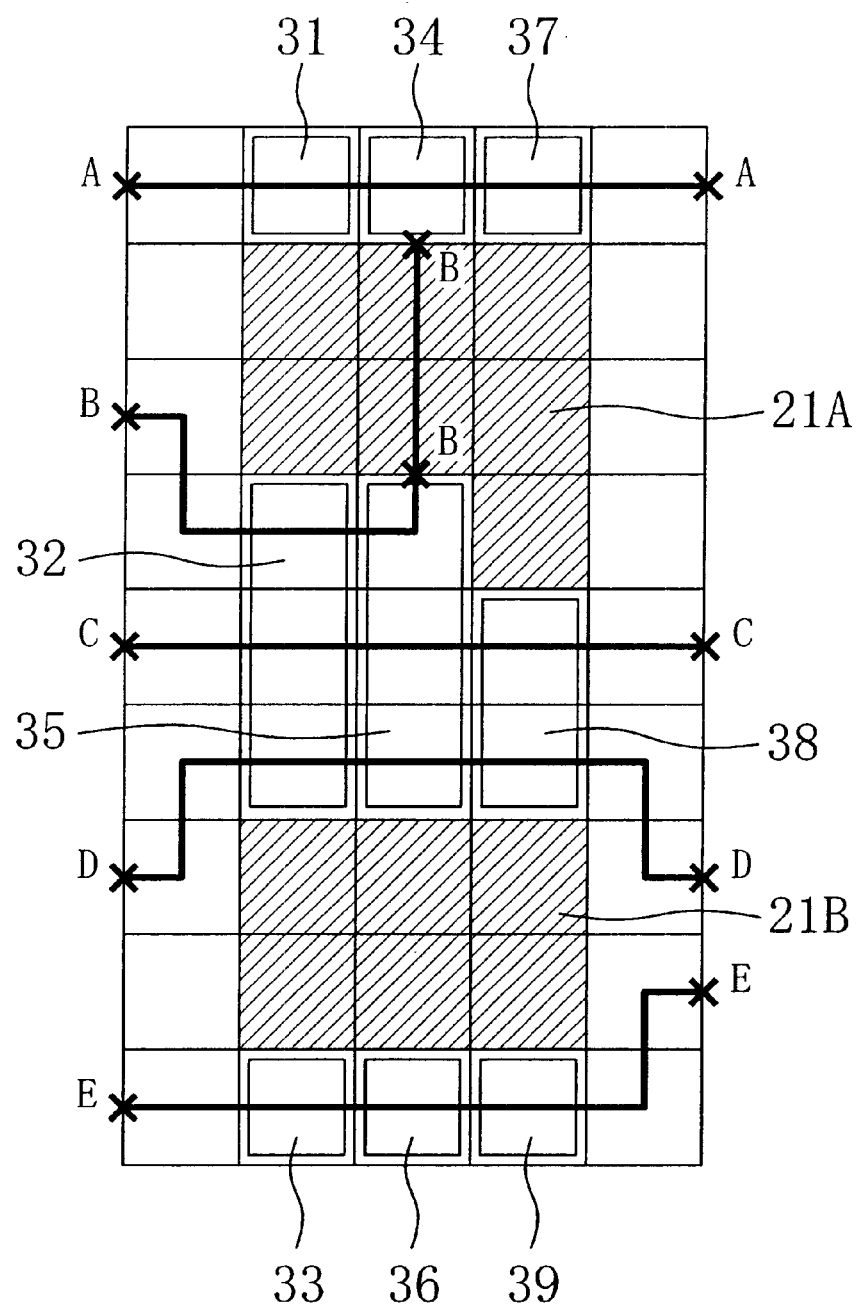
FIG. 5 illustrates a result of the routing path finding process of the first embodiment.

In Step S8, routing paths are re-found for Nets A and B, which should pass the sub-regions 31 and 34 with the negative availability. Then, in Step S9, the sub-region passage cost is added again for each of the routing paths re-found in Step S8, thereby recalculating the routing path cost. As a result, in the arrangement shown in FIG. 5, after the component 21A has been moved upward, Net C is routed successfully, Net A is routed by way of the sub-regions 31, 34 and 37 and Net B is routed via the sub-regions 32 and 35. In this process step S8, to end the program without entering the infinite loop, the maximum number of times the component can be moved is specified externally and the process is limited to this number.

In this manner, according to this embodiment, if Net C is non-routable as shown in FIG. 3, then the component 21A is moved as shown in FIG. 4, thereby arranging the available grid points 88, 89 and 90 in a row. Accordingly, the open net C can be routed using these grid points 88, 89 and 90 with the height constraint 101 satisfied and without increasing the number of grid points in the column direction.

In addition, even if some sub-regions 31, 34 and 37 come to have a negative availability as a result of the movement of the component 21A, then Nets A and B, which passed these sub-regions, are rerouted using other grid points. Thus, the number of open nets can be minimized and all of the nets can be routed successfully with much more certainty.

In the foregoing embodiment, multiple sub-regions are extracted from each grid column in which the components 21A and 21B are located, the availability is calculated for each of these sub-regions and then the component 21A is moved if there is any open net. However, the present invention is not limited to such a specific embodiment. Rather, the embodiment proposed by us in the above-identified U.S. patent application, in which the availability is calculated for each grid column and then a component is moved if there is any open net, also falls within the scope of the present invention.

EMBODIMENT 2

Next, a second embodiment of the present invention will be described.

Figure 12:
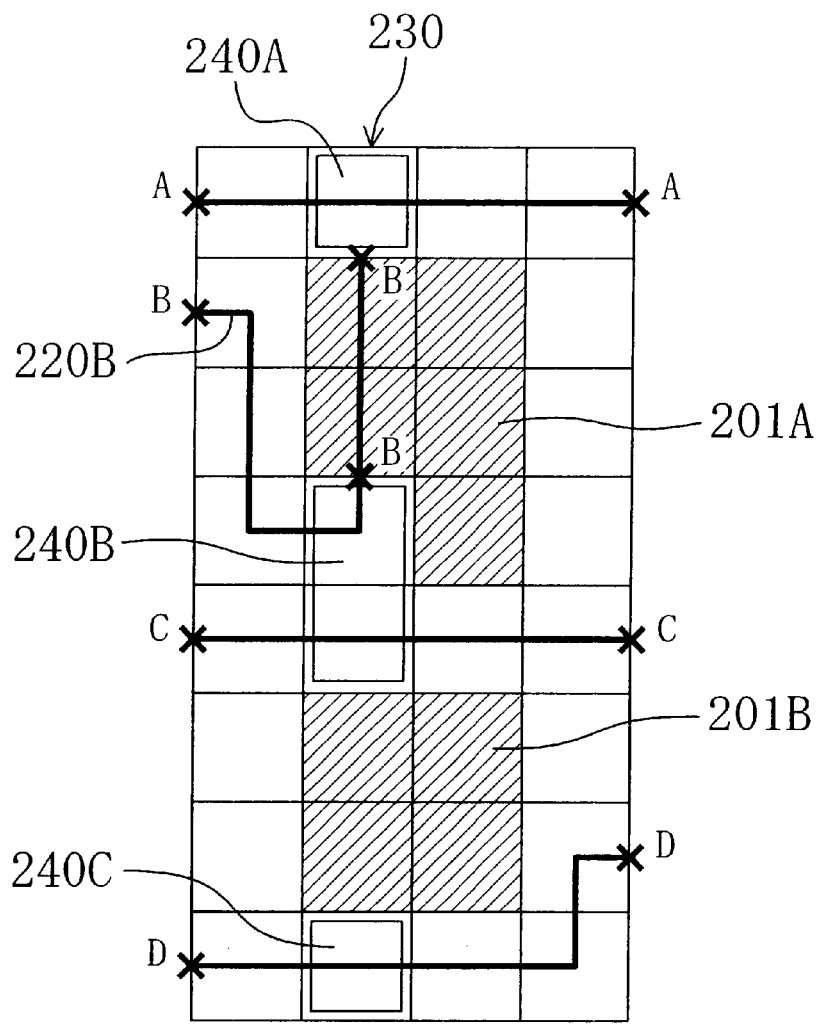
FIG. 12 illustrates a result of a routing path finding process according to a second embodiment of the present invention.

FIG. 12 illustrates how to route nets by the routing path finding method of the first embodiment in accordance with other interconnection information.

As shown in FIG. 12, a grid column 230 is partitioned into three sub-regions 240A, 240B and 240C by two components 201A and 201B, each of which is placed over two grid columns. Once Net A has been routed, the sub-region 240A comes to have an availability of "0". Thus, a wire 220B for Net B passes the sub-region 240B with an availability of "1".

Figure 13:
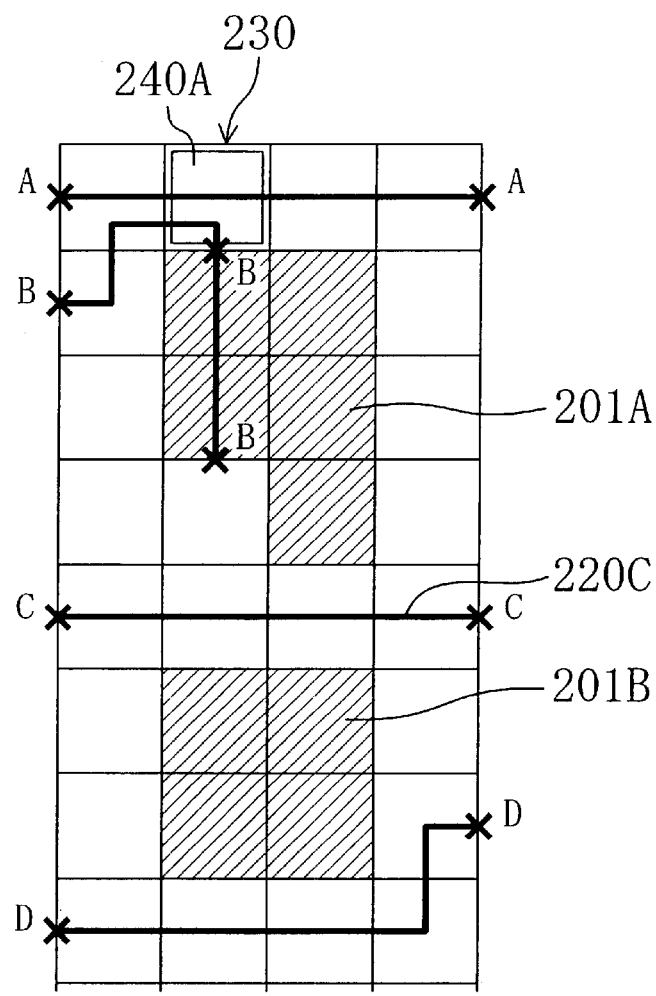
FIG. 13 illustrates a result of a routing path finding process proposed by the present inventors as a comparative example of the routing path finding method of the second embodiment.

According to the method proposed by the present inventors in the above-identified patent application, availability is obtained for each grid column as shown in FIG. 13. Thus, as for the grid column 230, the number of nets already routed and the number of routable nets are both "4", and therefore its availability is "0". Actually, though, two nets pass through the single grid point in the sub-region 240A. Accordingly, Nets A and B are non-routable. In contrast, according to this embodiment, such inconvenience is avoidable. In the example illustrated in FIG. 13, each of the components 201A and 201B overlaps two grid columns. If the component 201A or 201B overlaps just one grid column, however, then other grid columns are not affected by the component 201A or 201B at all. Accordingly, intended paths, satisfying the height constraint, can be obtained if compaction is carried out after the routing has been performed.

In this embodiment, the sub-regions 240A, 240B and 240C, obtained by getting the grid column 230 partitioned by the components 201A and 201B, are extracted from the grid column 230 and the availability is calculated for each of these sub-regions 240A, 240B and 240C. Accordingly, whether the components 201A and 201B are moved or not, the number of open nets can be minimized and all of the nets are much more likely to be routed successfully.

In the foregoing embodiments, the present invention has been described as being applied to a situation where only the height constraint is imposed on the routing region. However, the present invention is not limited to such specific embodiments, but is equally applicable even if only the width constraint or both the height and width constraints are imposed.

As described above, according to the present invention, a parameter representing the availability of grid points is prepared for each of multiple sub-regions included in a routing region. Alternatively or additionally, if there is any open net, a component like a transistor is moved, thereby arranging available grid points along a column or row. Thus, the number of open nets can be drastically cut down and all of the nets can be routed successfully.

What is claimed is:

1. A method for finding a routing path during an automated routing/designing process of an LSI by applying a maze algorithm to a routing region partitioned into multiple grid points arranged in columns and rows, a routing path cost being calculated by adding a cost every time one of the grid points is passed responsive to a request that terminals of a component, placed in the routing region, be interconnected, the method comprising the steps of:

a) extracting multiple sub-regions from each said column or row in the routing region, the sub-regions being formed by getting the column or row partitioned by the component and a routing forbidden region;

b) obtaining a parameter for each said sub-region, which has been extracted in the step a), based on the number of nets that can pass the sub-region and the number of nets already routed in the sub-region;

c) calculating, using the parameter obtained in the step b), the cost to be added every time one of the grid points is passed;

d) moving the component such that available ones of the sub-regions are arranged in line if there is any open net between any pair of the terminals to be interconnected; and e) recalculating the routing path cost by performing the steps b) and c) after the step d) has been performed.

2. A computer-readable storage medium having stored thereon a routing path finding program, the program being used to find a routing path during an automated routing/designing process of an LSI by applying a maze algorithm to a routing region partitioned into multiple grid points arranged in columns and rows, a routing path cost being calculated by adding a cost every time one of the grid points is passed responsive to a request that terminals of a component, placed in the routing region, be interconnected, the program comprising the steps of:

a) extracting multiple sub-regions from each said column or row in the routing region, the sub-regions being formed by getting the column or row partitioned by the component and a routing forbidden region;

b) obtaining a parameter for each said sub-region, which has been extracted in the step a), based on the number of nets that can pass the sub-region and the number of nets already routed in the sub-region;

c) calculating, using the parameter obtained in the step b), the cost to be added every time one of the grid points is passed;

d) moving the component such that available ones of the sub-regions are arranged in line if there is, any open net between any pair of the terminals to be interconnected; and e) recalculating the routing path cost by performing the steps b) and c) after the step d) has been performed.

3. The method of claim 1, wherein in the step b), the parameter obtained for each said sub-region is availability of grid points, the availability being obtained by subtracting the number of grid points occupied by the nets already routed from the number of grid points included in the sub-region.

4. The method of claim 1, wherein the component overlaps at least two of the grid columns or at least two of the grid rows.

5. The method of claim 1, further comprising the steps of:

determining, after the component has been moved, whether or not there is any sub-region in which the number of nets already routed exceeds the number of nets that can pass the sub-region; and if there is any such sub-region in which the number of nets already routed exceeds the number of nets that can pass the sub-region, rerouting the nets passing the sub-region.

6. The storage medium of claim 2, wherein in the step b), the parameter obtained for each said sub-region is availability of grid points, the availability being obtained by subtracting the number of grid points occupied by the nets already routed from the number of grid points included in the sub-region.

7. The storage medium of claim 2, wherein the program further comprises the steps of:

determining, after the component has been moved, whether or not there is any sub-region in which the number of nets already routed exceeds the number of nets that can pass the sub-region; and if there is any such sub-region in which the number of nets already routed exceeds the number of nets that can pass the sub-region, rerouting the nets passing the sub-region.

* * * * *